(12) United States Patent
Terasaki

(10) Patent No.: US 11,094,606 B2
(45) Date of Patent: Aug. 17, 2021

(54) BONDED BODY, INSULATED CIRCUIT BOARD WITH HEAT SINK, AND HEAT SINK

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 16/755,922

(22) PCT Filed: Oct. 25, 2018

(86) PCT No.: PCT/JP2018/039693
§ 371 (c)(1),
(2) Date: Apr. 14, 2020

(87) PCT Pub. No.: WO2019/082973
PCT Pub. Date: May 2, 2019

(65) Prior Publication Data
US 2020/0294882 A1    Sep. 17, 2020

(30) Foreign Application Priority Data

Oct. 27, 2017  (JP) .............................. JP2017-208318
Oct. 22, 2018  (JP) .............................. JP2018-198468

(51) Int. Cl.
*H01L 23/373*    (2006.01)
*H01L 23/14*    (2006.01)

(52) U.S. Cl.
CPC ........ *H01L 23/3736* (2013.01); *H01L 23/142* (2013.01)

(58) Field of Classification Search
CPC ............. H01L 23/3735; H01L 23/3736; H01L 23/473; H01L 2224/32225
See application file for complete search history.

(56) References Cited

U.S. PATENT DOCUMENTS

2005/0029333 A1* 2/2005 Koyama ............... B32B 15/018
228/245
2013/0206822 A1* 8/2013 Murase .............. B23K 20/2336
228/221
(Continued)

FOREIGN PATENT DOCUMENTS

EP    3269491 A1    1/2018
EP    3285291 A1    2/2018
(Continued)

OTHER PUBLICATIONS

International Search Report dated Dec. 25, 2018, issued for PCT/JP2018/039693 and English translation thereof.
(Continued)

*Primary Examiner* — Allan R Wilson
(74) *Attorney, Agent, or Firm* — Locke Lord LLP

(57) ABSTRACT

An aluminum alloy member is made of an aluminum alloy having a Mg concentration set in a range of 0.4 mass % or more and 7.0 mass % or less and a Si concentration set to less than 1 mass %, the aluminum alloy member and a copper member are bonded to each other through solid-phase diffusion, and a compound layer made up of a first intermetallic compound layer that is disposed on the aluminum alloy member side and made of a θ phase of an intermetallic compound of Cu and Al, a second intermetallic compound layer that is disposed on the copper member side and made of a $\gamma_2$ phase of an intermetallic compound of Cu and Al, and a Cu—Al—Mg layer provided between the first intermetallic compound layer and the second intermetallic compound layer is provided in a bonding interface between the aluminum alloy member and the copper member.

9 Claims, 9 Drawing Sheets

(56) References Cited

U.S. PATENT DOCUMENTS

2018/0108593 A1    4/2018    Terasaki et al.
2019/0067214 A1*    2/2019    Sato ........................ H01L 23/24

FOREIGN PATENT DOCUMENTS

| | | |
|---|---|---|
| JP | 3171234 B2 | 5/2001 |
| JP | 2012-064801 A | 3/2012 |
| JP | 2014-099596 A | 5/2014 |
| JP | 2014-160799 A | 9/2014 |
| JP | 2016-168625 A | 9/2016 |
| JP | 2016-208009 A | 12/2016 |
| JP | 2016-208010 A | 12/2016 |
| JP | 2017-139508 A | 8/2017 |

OTHER PUBLICATIONS

Supplementary European Search Report dated Jun. 23, 2021, issued for European Patent Application No. 18870413.4.

* cited by examiner

BONDED BODY, INSULATED CIRCUIT BOARD WITH HEAT SINK, AND HEAT SINK

TECHNICAL FIELD

This invention relates to a bonded body in which an aluminum alloy member made of an aluminum alloy and a copper member made of copper or a copper alloy are bonded to each other, an insulated circuit board with a heat sink in which a heat sink is bonded to an insulated circuit board having a circuit layer provided on one surface of an insulating layer, and a heat sink in which a copper member layer is provided on a heat sink main body.

Priority is claimed on Japanese Patent Application No. 2017-208318, filed Oct. 27, 2017, and Japanese Patent Application No. 2018-198468, filed Oct. 22, 2018, the contents of which are incorporated herein by reference.

BACKGROUND ART

Semiconductor devices such as LEDs or power modules have a structure in which a semiconductor element is bonded onto a circuit layer made of a conductive material.

In power semiconductor elements for high-power control used to control wind-power generation, electric vehicles, hybrid vehicles, and the like, the amount of heat generated is large, and thus, as a substrate on which the power semiconductor element is mounted, for example, an insulated circuit board including a ceramic substrate made of aluminum nitride (AlN), alumina ($Al_2O_3$), or the like and a circuit layer provided by bonding a metal plate having an excellent conductive property to one surface of the ceramic substrate has been broadly used in the related art. As a substrate for a power module, a substrate having a metal layer provided on the other surface of the ceramic substrate is also provided.

For example, a power module described in Patent Document 1 is provided with a structure including an insulated circuit board having a circuit layer and a metal layer made of aluminum or an aluminum alloy provided on each of one surface and the other surface of a ceramic substrate and a semiconductor element bonded onto the circuit layer through a solder material.

In addition, the power module is provided with a configuration in which a heat sink is bonded to the metal layer side of the insulated circuit board and heat transferred from the semiconductor element toward the insulated circuit board side is diffused to the outside through the heat sink.

In a case where the circuit layer and the metal layer are made of aluminum or an aluminum alloy as in the powder module described in Patent Document 1, an Al oxide film is provided on the surface, and thus there is a problem in that it is not possible to bond the semiconductor element or the heat sink through the solder material.

Therefore, Patent Document 2 proposes an insulated circuit board in which a circuit layer and a metal layer have a laminate structure of an Al layer and a Cu layer. In this insulated circuit board, the Cu layer is disposed on the surface of each of the circuit layer and the metal layer, and thus it is possible to favorably bond a semiconductor element and a heat sink using a solder material. Therefore, heat resistance in the lamination direction becomes small, and it becomes possible to efficiently transfer heat generated from the semiconductor element toward the heat sink side.

As described in Patent Document 2, an insulated circuit board having a structure in which a heat dissipation plate is used as a heat sink and a cooling portion is screwed to this heat dissipation plate using a fastening screw.

In addition, Patent Document 3 proposes an insulated circuit board with a heat sink in which one of a metal layer and a heat sink is made of aluminum or an aluminum alloy, the other is made of copper or a copper alloy, and the metal layer and the heat sink are bonded to each other through solid-phase diffusion. In this insulated circuit board with a heat sink, the metal layer and the heat sink are bonded to each other through solid-phase diffusion, and thus heat resistance is small, and the heat dissipation characteristic is excellent.

Furthermore, Patent Document 4 proposes an insulated circuit board with a heat sink in which a heat sink made of an aluminum alloy having a Si concentration of 1 mass % or more and 25 mass % or less and a metal layer made of copper are bonded to each other through solid-phase diffusion. In addition, an insulated circuit board with a heat sink in which a heat sink main body made of an aluminum alloy having a Si concentration of 1 mass % or more and 25 mass % or less and a metal member layer made of copper are bonded to each other through solid-phase diffusion.

CITATION LIST

Patent Literature

[Patent Document 1]
  Japanese Patent No. 3171234
[Patent Document 2]
  Japanese Unexamined Patent Application, First Publication No. 2014-160799
[Patent Document 3]
  Japanese Unexamined Patent Application, First Publication No. 2014-099596
[Patent Document 4]
  Japanese Unexamined Patent Application, First Publication No. 2016-208010

SUMMARY OF INVENTION

Technical Problem

In a case where an aluminum member made of aluminum or an aluminum alloy and a copper member made of copper or a copper alloy are bonded to each other through solid-phase diffusion as described in Patent Document 2 to 4, in a bonding interface between the aluminum member and the copper member, an intermetallic compound made up of copper and aluminum is provided. Here, as the intermetallic compound made up of copper and aluminum, there is a plurality of phases as shown in FIG. 1. Therefore, an intermetallic compound layer provided in the bonding interface between the aluminum member and the copper member has a structure in which individual phases of a θ phase, an $\eta_2$ phase, a $\zeta_2$ phase, a δ phase, and a $\gamma_2$ phase are laminated together.

Here, the $\eta_2$ phase, the $\zeta_2$ phase, and the δ phase are relatively hard, and thus there is problem in that a metal compound layer cracks when loaded with a hot-cold cycle, heat resistance becomes high, and the bonding rate decreases.

The present invention has been made in consideration of the aforementioned circumstances, and an object of the present invention is to provide a bonded body capable of suppressing the provision of a relatively hard intermetallic compound layer in a bonding interface even in the case of bonding an aluminum member made of aluminum or an aluminum alloy and a copper member made of copper or a copper alloy through solid-phase diffusion and capable of suppressing an increase in heat resistance under a hot-cold cycle load or a decrease in the bonding rate, an insulated circuit board with a heat sink and a heat sink which include the bonded body.

Solution to Problem

In order to achieve the aforementioned object, a bonded body of the present invention is a bonded body having an aluminum alloy member made of an aluminum alloy and a copper member made of copper or a copper alloy that are bonded to each other, in which the aluminum alloy member is made of an aluminum alloy having a Mg concentration set in a range of 0.4 mass % or more and 7.0 mass % or less and a Si concentration set to less than 1 mass %, the aluminum alloy member and the copper member are bonded to each other through solid-phase diffusion, a compound layer provided by diffusion of metal atoms in the aluminum alloy member and Cu atoms in the copper member is provided in a bonding interface between the aluminum alloy member and the copper member, and the compound layer is made up of a first intermetallic compound layer that is disposed on the aluminum alloy member side and made of a θ phase of an intermetallic compound of Cu and Al, a second intermetallic compound layer that is disposed on the copper member side and made of a $\gamma_2$ phase of an intermetallic compound of Cu and Al, and a Cu—Al—Mg layer provided between the first intermetallic compound layer and the second intermetallic compound layer.

According to the bonded body having this configuration, the compound layer provided by the diffusion of metal atoms in the aluminum alloy member and Cu atoms in the copper member is provided, and this compound layer is made up of the first intermetallic compound layer that is disposed on the aluminum alloy member side and made of a θ phase of an intermetallic compound of Cu and Al, the second intermetallic compound layer that is disposed on the copper member side and made of a $\gamma_2$ phase of an intermetallic compound of Cu and Al, and the Cu—Al—Mg layer provided between the first intermetallic compound layer and the second intermetallic compound layer, and thus the growth of the intermetallic compound layer of Cu and Al is suppressed by the Cu—Al—Mg layer, whereby an $\eta_2$ phase, a $\zeta_2$ phase, and a δ phase, which are relatively hard, are not provided, and it is possible to suppress the generation of a crack in the compound layer when loaded with a hot-cold cycle.

Here, in the bonded body of the present invention, a magnesium oxide film may be provided on a bonding surface of the aluminum alloy member.

In this case, it is possible to suppress the diffusion of Al atoms by the magnesium oxide film and suppress the intermetallic compounds growing more than necessary. Therefore, it is possible to further suppress the generation of a crack in the compound layer when loaded with a hot-cold cycle.

In addition, in the bonded body of the present invention, the magnesium oxide film preferably has a crystalline granular body.

In this case, the strength of the magnesium oxide film improves, and it becomes possible to further improve the bonding strength.

An insulated circuit board with a heat sink of the present invention is an insulated circuit board with a heat sink including an insulating layer, a circuit layer provided on one surface of the insulating layer, a metal layer provided on an other surface of the insulating layer, and a heat sink disposed on a surface of the metal layer opposite to the insulating layer, in which a bonding surface with the heat sink of the metal layer is made of copper or a copper alloy, a bonding surface with the metal layer of the heat sink is made of an aluminum alloy having a Mg concentration set in a range of 0.4 mass % or more and 7.0 mass % or less and a Si concentration set to less than 1 mass %, the heat sink and the metal layer are bonded to each other through solid-phase diffusion, a compound layer provided by diffusion of metal atoms in the aluminum alloy and Cu atoms in the copper member is provided in a bonding interface between the heat sink and the metal layer, and this compound layer is made up of a first intermetallic compound layer that is disposed on the heat sink side and made of a 0 phase of an intermetallic compound of Cu and Al, a second intermetallic compound layer that is disposed on the metal layer side and made of a $\gamma_2$ phase of an intermetallic compound of Cu and Al, and a Cu—Al—Mg layer provided between the first intermetallic compound layer and the second intermetallic compound layer.

According to the insulated circuit board with a heat sink having this configuration, the compound layer provided by the diffusion of metal atoms in the aluminum alloy and Cu atoms in the copper member is provided in the bonding interface between the heat sink and the metal layer, and this compound layer is made up of the first intermetallic compound layer that is disposed on the heat sink side and made of a θ phase of an intermetallic compound of Cu and Al, the second intermetallic compound layer that is disposed on the metal layer side and made of a $\gamma_2$ phase of an intermetallic compound of Cu and Al, and the Cu—Al—Mg layer provided between the first intermetallic compound layer and the second intermetallic compound layer, and thus the growth of the intermetallic compound layer of Cu and Al is suppressed by the Cu—Al—Mg layer, whereby an $\eta_2$ phase, a $\zeta_2$ phase, and a δ phase, which are relatively hard, are not provided, and it is possible to suppress the generation of a crack in the compound layer when loaded with a hot-cold cycle.

Here, in the insulated circuit board with a heat sink of the present invention, a magnesium oxide film may be provided on a bonding surface of the heat sink.

In this case, it is possible to suppress the diffusion of Al atoms by the magnesium oxide film and suppress the intermetallic compounds growing more than necessary. Therefore, it is possible to further suppress the generation of a crack in the compound layer when loaded with a hot-cold cycle.

In addition, in the insulated circuit board with a heat sink of the present invention, the magnesium oxide film preferably has a crystalline granular body.

In this case, the strength of the magnesium oxide film improves, and it becomes possible to further improve the bonding strength.

A heat sink of the present invention is a heat sink including a heat sink main body and a copper member layer that is bonded to the heat sink main body and made of copper or a copper alloy, in which the heat sink main body is made of an aluminum alloy having a Mg concentration set in a range of 0.4 mass % or more and 7.0 mass % or less and a Si concentration set to less than 1 mass %, the heat sink main body and the copper member layer are bonded to each other through solid-phase diffusion, a compound layer provided by diffusion of metal atoms in the heat sink main body and Cu atoms in the copper member layer is provided in a bonding interface between the heat sink main body and the copper member layer, and this compound layer is made up of a first intermetallic compound layer that is disposed on the heat sink main body side and made of a θ phase of an intermetallic compound of Cu and Al, a second intermetallic compound layer that is disposed on the copper member layer side and made of a $\gamma_2$ phase of an intermetallic compound of Cu and Al, and a Cu—Al—Mg layer provided between the first intermetallic compound layer and the second intermetallic compound layer.

According to the heat sink having this configuration, the compound layer provided by the diffusion of metal atoms in the heat sink main body and Cu atoms in the copper member layer is provided in the bonding interface between the heat sink main body and the copper member layer, and this compound layer is made up of the first intermetallic compound layer that is disposed on the heat sink main body side and made of a θ phase of an intermetallic compound of Cu and Al, the second intermetallic compound layer that is disposed on the copper member layer side and made of a $\gamma_2$ phase of an intermetallic compound of Cu and Al, and the Cu—Al—Mg layer provided between the first intermetallic compound layer and the second intermetallic compound layer, and thus the growth of the intermetallic compound layer of Cu and Al is suppressed by the Cu—Al—Mg layer, whereby an $\eta_2$ phase, a $\zeta_2$ phase, and a δ phase, which are relatively hard, are not provided, and it is possible to suppress the generation of a crack in the compound layer when loaded with a hot-cold cycle.

Here, in the heat sink of the present invention, a magnesium oxide film may be provided on a bonding surface of the heat sink main body.

In this case, it is possible to suppress the diffusion of Al atoms by the magnesium oxide film and suppress the intermetallic compounds growing more than necessary. Therefore, it is possible to further suppress the generation of a crack in the compound layer when loaded with a hot-cold cycle.

In addition, in the heat sink of the present invention, the magnesium oxide film preferably has a crystalline granular body.

In this case, the strength of the magnesium oxide film improves, and it becomes possible to further improve the bonding strength.

Advantageous Effects of Invention

According to the present invention, it becomes possible to provide a bonded body capable of suppressing the provision of a relatively hard intermetallic compound layer in a bonding interface even in the case of bonding an aluminum member made of aluminum or an aluminum alloy and a copper member made of copper or a copper alloy through solid-phase diffusion and capable of suppressing an increase in heat resistance under a hot-cold cycle load or a decrease in the bonding rate, an insulated circuit board with a heat sink and a heat sink which include the bonded body.

DESCRIPTION OF EMBODIMENTS

First Embodiment

Hereinafter, embodiments of the present invention will be described with reference to accompanying drawings.

Figure 1:
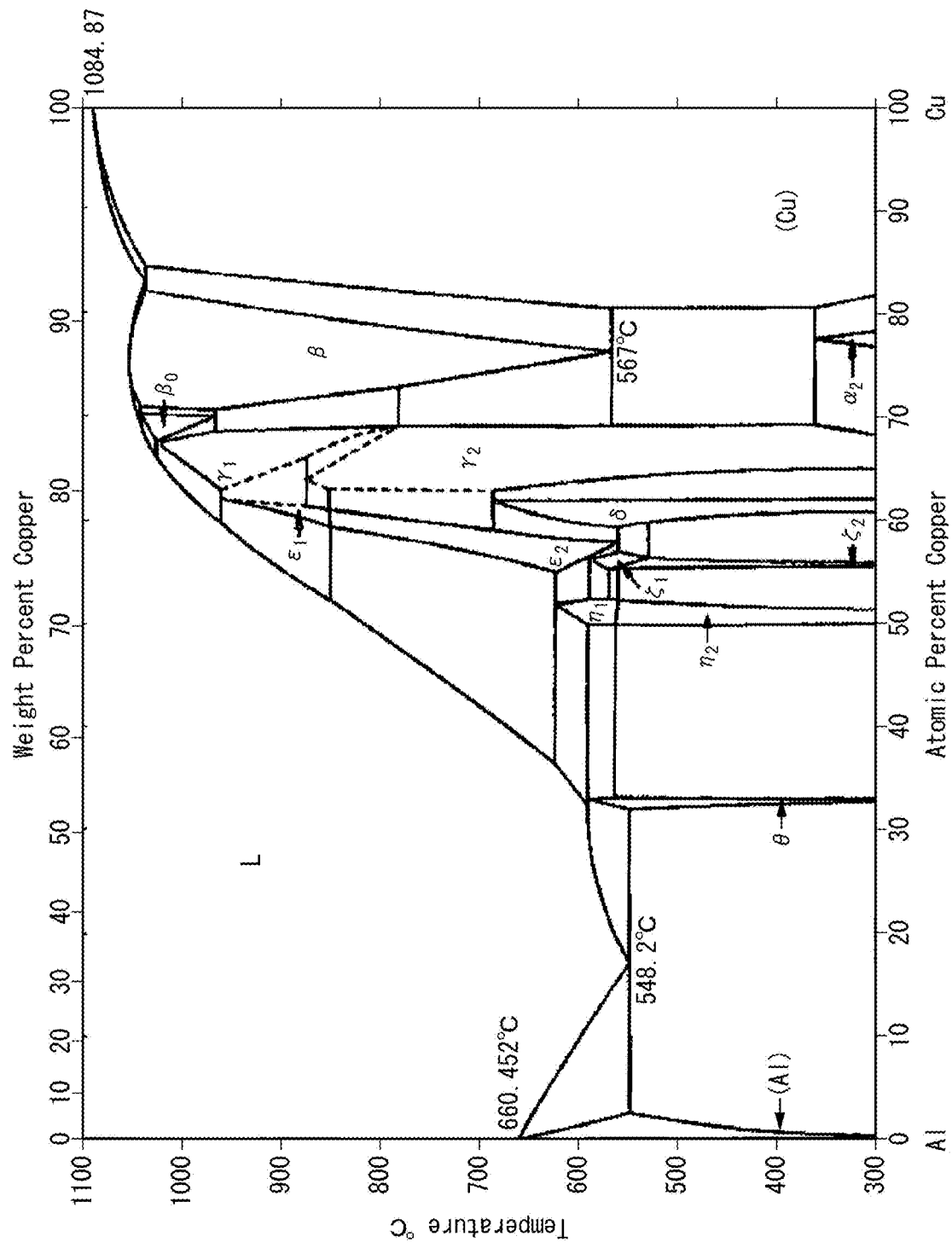
FIG. 1 is a binary phase diagram of Cu and Al.
Figure 2:
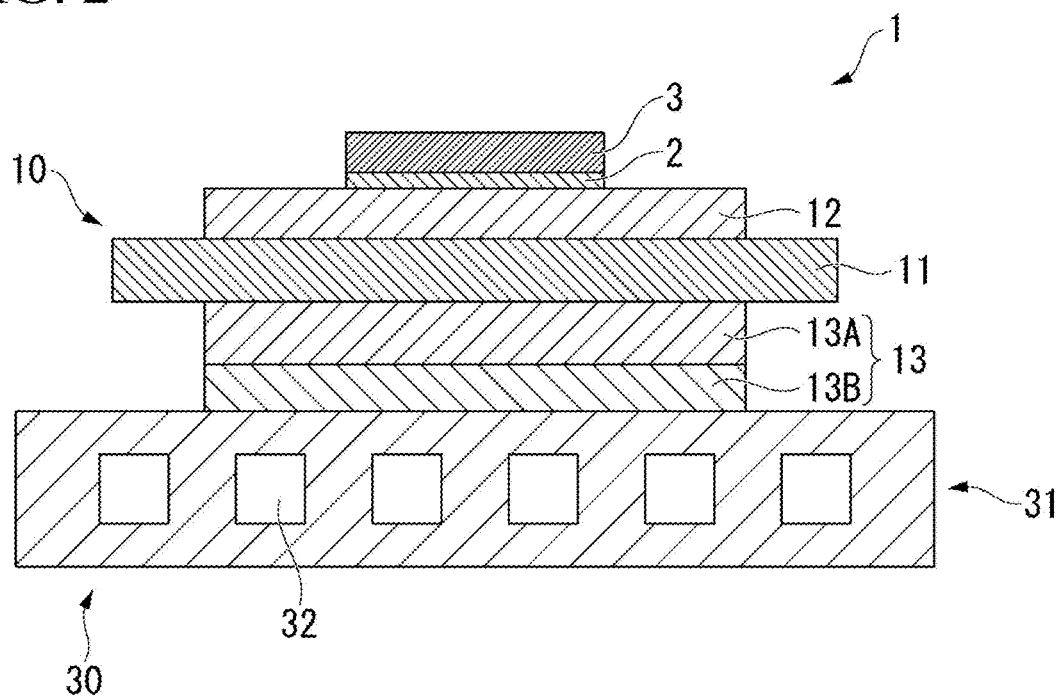
FIG. 2 is a schematic explanatory view of a power module including an insulated circuit board with a heat sink according to a first embodiment of the present invention.

FIG. 2 shows a power module 1 in which an insulated circuit board with a heat sink 30, which is a first embodiment of the present invention, is used.

This power module 1 includes the insulated circuit board with a heat sink 30 and a semiconductor element 3 bonded to one surface (upper surface in FIG. 2) of the insulated circuit board with a heat sink 30 through a solder layer 2.

The insulated circuit board with a heat sink 30 includes an insulated circuit board 10 and a heat sink 31 bonded to the insulated circuit board 10.

The insulated circuit board 10 includes a ceramic substrate 11 configuring an insulating layer, a circuit layer 12 disposed on one surface (upper surface in FIG. 2) of the ceramic substrate 11, and a metal layer 13 disposed on the other surface of the ceramic substrate 11.

The ceramic substrate 11 is made of ceramic such as silicon nitride ($Si_3N_4$), aluminum nitride (AlN), or alumina ($Al_2O_3$) that is excellent in an insulating property and a heat dissipation property. In the present embodiment, the ceramic substrate 11 is made of aluminum nitride (AlN) that is excellent particularly in a heat dissipation property. In addition, the thickness of the ceramic substrate 11 is set to be in a range of, for example, 0.2 to 1.5 mm and, in the present embodiment, set to 0.635 mm.

Figure 5:
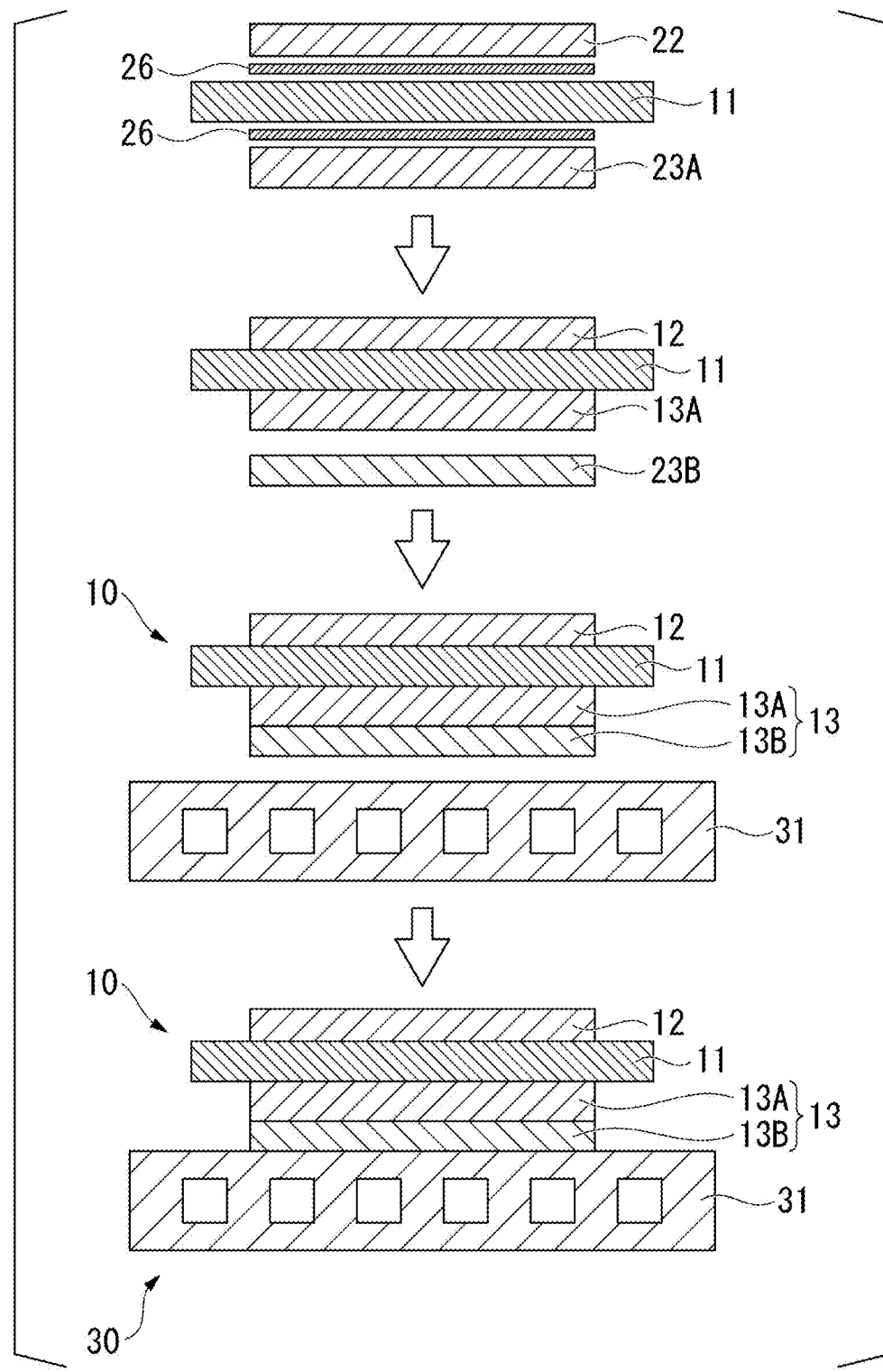
FIG. 5 is a schematic explanatory view of the method for manufacturing the insulated circuit board with a heat sink according to the first embodiment.

The circuit layer 12 is provided by bonding an aluminum plate 22 made of aluminum or an aluminum alloy to one surface of the ceramic substrate 11 as shown in FIG. 5. In the present embodiment, the circuit layer 12 is provided by bonding a rolled plate (aluminum plate 22) of aluminum having a purity of 99 mass % or more (2N aluminum) or aluminum having a purity of 99.99 mass % or more (4N aluminum) to the ceramic substrate 11. The thickness of the aluminum plate 22 that serves as the circuit layer 12 is set to be in a range of 0.1 mm or more and 1.0 mm or less and, in the present embodiment, set to 0.6 mm.

The metal layer 13 has an Al layer 13A disposed on the other surface of the ceramic substrate 11 and a Cu layer 13B laminated on a surface of the Al layer 13A opposite to the surface to which the ceramic substrate 11 is bonded as shown in FIG. 2.

The Al layer 13A is provided by bonding an aluminum plate 23A made of aluminum or an aluminum alloy to the other surface of the ceramic substrate 11 as shown in FIG. 5. In the present embodiment, the Al layer 13A is provided by bonding a rolled plate (aluminum plate 23A) of aluminum having a purity of 99 mass % or more (2N aluminum) or aluminum having a purity of 99.99 mass % or more (4N aluminum) to the ceramic substrate 11. The thickness of the aluminum plate 23A to be bonded is set to be in a range of 0.1 mm or more and 3.0 mm or less and, in the present embodiment, set to 0.6 mm. The Cu layer 13B is provided by bonding a copper plate 23B made of copper or a copper alloy to the other surface of the Al layer 13A as shown in FIG. 5. In the present embodiment, the Cu layer 13B is provided by bonding a rolled plate (copper plate 23B) of oxygen-free copper. The thickness of the Cu layer 13B is set to be in a range of 0.1 mm or more and 6 mm or less and, in the present embodiment, set to 1 mm.

The heat sink 31 is a member for diffusing heat from the insulated circuit board 10, and, in the present embodiment, flow paths 32 through which a cooling medium flows are provided as shown in FIG. 2. The heat sink 31 is made of an aluminum alloy having a Mg concentration set in a range of 0.4 mass % or more and 7.0 mass % or less and a Si concentration set to less than 1 mass %. In this aluminum alloy, it is preferable that the Si concentration is less than 1 mass % and Si is not precipitated. A Si-containing intermetallic compound may be precipitated.

Here, the heat sink 31 and the metal layer 13 (Cu layer 13B) are bonded to each other through solid-phase diffusion.

Figure 3:
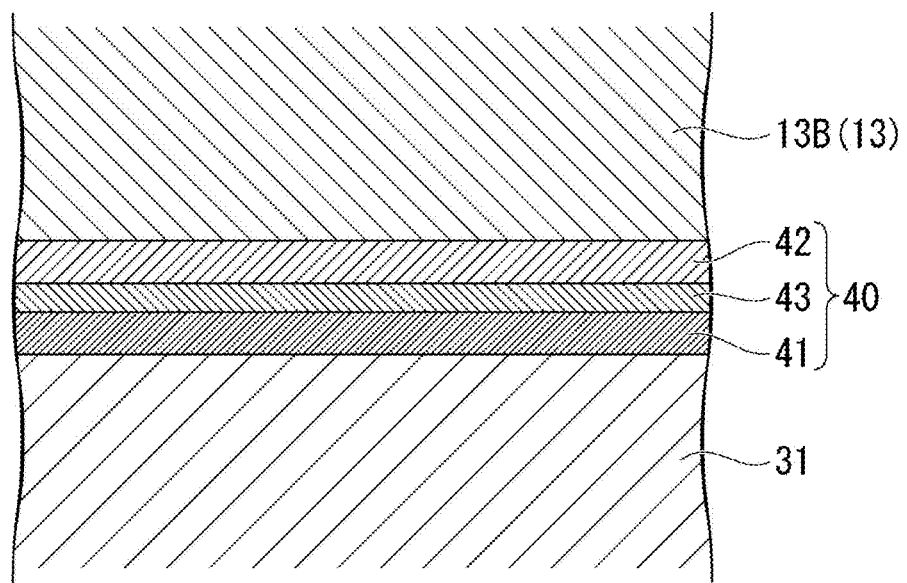
FIG. 3 is an enlarged cross-sectional explanatory view of a bonding interface between a heat sink and a metal layer (Cu layer) of the insulated circuit board with a heat sink shown in FIG. 2.

In the bonding interface between the metal layer 13 (Cu layer 13B) and the heat sink 31, as shown in FIG. 3, a compound layer 40 is provided. This compound layer 40 is provided by the mutual diffusion of metal atoms in the heat sink 31 and Cu atoms in the metal layer 13 (Cu layer 13B).

In addition, as shown in FIG. 3, this compound layer 40 is made up of a first intermetallic compound layer 41 that is disposed on the heat sink 31 side and made of a θ phase of an intermetallic compound of Cu and Al, a second intermetallic compound layer 42 that is disposed on the metal layer 13 (Cu layer 13B) side and made of a $\gamma_2$ phase of an intermetallic compound of Cu and Al, and a Cu—Al—Mg layer 43 provided between the first intermetallic compound layer 41 and the second intermetallic compound layer 42.

In the present embodiment, the Cu—Al—Mg layer 43 is made of $Cu_6Al_5Mg_2$, $CuAl_2Mg$, $Cu_3Al_7Mg_6$, $CuAlMg$, or the like, which is an intermetallic compound of Cu, Al, and Mg.

In addition, Mg in this Cu—Al—Mg layer 43 is Mg that has diffused from the aluminum alloy configuring the heat sink 31. Therefore, in a vicinity of the bonding interface of the heat sink 31, a Mg-deficient layer deficient in Mg is provided.

Here, the thickness of the compound layer 40 is set to be in a range of 10 µm or more and 70 µm or less and preferably set in a range of 15 µm or more and 40 µm or less.

In addition, the thickness of the Cu—Al—Mg layer 43 is set to be in a range of 1 µm or more and 45 µm or less and preferably set in a range of 2.5 µm or more and 30 µm or less.

In the bonding interface between the heat sink 31 and the metal layer 13 (Cu layer 13B), a magnesium oxide film may be provided on the bonding surface of the heat sink 31. This magnesium oxide film is provided by the reaction of an alumina film provided on the surface of the heat sink 31 with Mg in the heat sink 31 (aluminum alloy).

This magnesium oxide film is made of MgO or $MgAl_2O_4$. In addition, the magnesium oxide film preferably has a crystalline granular body. The crystalline granular body is generated by the reaction of an amorphous aluminum film with Mg, and thus the presence of the crystalline granular body leads to the sufficient progress of the reaction between the alumina film and Mg.

Figure 4:
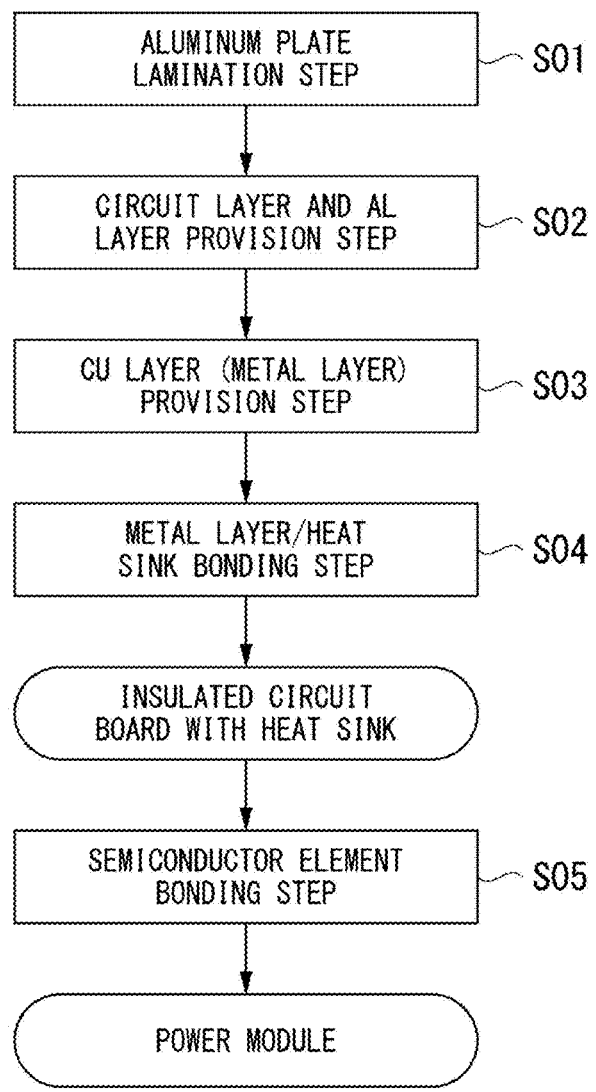
FIG. 4 is a flowchart showing a method for manufacturing the insulated circuit board with a heat sink according to the first embodiment.

Next, a method for manufacturing the insulated circuit board with a heat sink 30, which is the present embodiment, will be described with reference to FIG. 4 and FIG. 5.

(Aluminum Plate Lamination Step S01)

First, as shown in FIG. 5, the aluminum plate 22 that serves as the circuit layer 12 is laminated on one surface of the ceramic substrate 11 through an Al—Si-based brazing material foil 26.

In addition, the aluminum plate 23A that serves as the Al layer 13A is laminated on the other surface of the ceramic substrate 11 through an Al—Si-based brazing material foil 26. In the present embodiment, as the Al—Si-based brazing material foil 26, a 10 µm-thick Al-8 mass % Si alloy foil was used.

(Circuit Layer and Al Layer Provision Step S02)

In addition, the aluminum plate 22 and the ceramic substrate 11 are bonded to each other by being disposed and heated in a vacuum heating furnace in a state of being pressurized (at a pressure of 1 to 35 kgf/cm² (0.1 to 3.5 MPa)) in the lamination direction, thereby providing the circuit layer 12. In addition, the ceramic substrate 11 and the aluminum plate 23A are bonded to each other, thereby providing the Al layer 13A.

Here, it is preferable that the pressure in the vacuum heating furnace is set to be in a range of $10^{-6}$ Pa or more and $10^{-3}$ Pa or less, the heating temperature is set to be in a range of 600° C. or higher and 650° C. or lower, and the holding time at the heating temperature is set to be in a range of 15 minutes or longer and 180 minutes or shorter.

(Cu Layer (Metal Layer) Provision Step S03)

Next, the copper plate 23B that serves as the Cu layer 13B is laminated on the other surface of the Al layer 13A.

In addition, the Al layer 13A and the copper plate 23B are bonded to each other through solid-phase diffusion by being disposed and heated in a vacuum heating furnace in a state of being pressurized (at a pressure of 3 to 35 kgf/cm² (0.3 to 3.5 MPa)) in the lamination direction, thereby providing the metal layer 13.

Here, it is preferable that the pressure in the vacuum heating furnace is set to be in a range of $10^{-6}$ Pa or more and $10^{-3}$ Pa or less, the heating temperature is set to be in a range of 400° C. or higher and 548° C. or lower, and the holding time at the heating temperature is set to be in a range of five minutes or longer and 240 minutes or shorter.

The surfaces to be bonded of the Al layer 13A and the copper plate 23B each, which are to be bonded to each other through solid-phase diffusion, are flattened by removing damage on the surfaces in advance.

(Metal Layer/Heat Sink Bonding Step S04)

Next, the metal layer 13 (Cu layer 13B) and the heat sink 31 are laminated together, disposed, and heated in a vacuum heating furnace in a state of being pressurized (at a pressure of 5 to 35 kgf/cm² (0.5 to 3.5 MPa)) in the lamination direction, thereby bonding the metal layer 13 (Cu layer 13B) and the heat sink 31 through solid-phase diffusion. The surfaces to be bonded of the metal layer 13 (Cu layer 13B)

and the heat sink 31 each, which are to be bonded to each other through solid-phase diffusion, are flattened by removing damage on the surfaces in advance.

Here, it is preferable that the pressure in the vacuum heating furnace is set to be in a range of $10^{-6}$ Pa or more and $10^{-3}$ Pa or less, the heating temperature is set to be in a range of 400° C. or higher and 520° C. or lower, and the holding time at the heating temperature is set to be in a range of 30 minutes or longer and 240 minutes or shorter.

In this metal layer/heat sink bonding step S04, Cu atoms in the Cu layer 13B and Al atoms and Mg atoms in the heat sink 31 diffuse into each other, thereby providing the compound layer 40 made up of the first intermetallic compound layer 41, the Cu—Al—Mg layer 43, and the second intermetallic compound layer 42 as shown in FIG. 3.

In the bonding interface between the heat sink 31 and the metal layer 13 (Cu layer 13B), there is a case where a magnesium oxide film is provided on a surface portion of the heat sink 31. In addition, in the magnesium oxide film, due to the high heating temperature and the extension of the holding time in the metal layer/heat sink bonding step S04, the reaction between the aluminum film and Mg is accelerated, and the amorphous phase turns into a crystalline phase.

The insulated circuit board with a heat sink 30, which is the present embodiment, is manufactured as described above.

(Semiconductor Element Bonding Step S05)

Next, the semiconductor element 3 is laminated on one surface (front surface) of the circuit layer 12 through a brazing filler metal and bonded in a reducing furnace.

The power module 1, which is the present embodiment, is manufactured as described above.

According to the insulated circuit board with a heat sink 30 according to the present embodiment configured as described above, the compound layer 40 provided by the mutual diffusion of Al atoms and Mg atoms in an aluminum alloy configuring the heat sink 31 and Cu atoms in the metal layer 13 (Cu layer 13B) is provided in the bonding interface between the heat sink 31 and the metal layer 13 (Cu layer 13B), and this compound layer 40 is made up of the first intermetallic compound layer 41 that is disposed on the heat sink 31 side and made of a θ phase of an intermetallic compound of Cu and Al, the second intermetallic compound layer 42 that is disposed on the metal layer 13 (Cu layer 13B) side and made of a $\gamma_2$ phase of an intermetallic compound of Cu and Al, and the Cu—Al—Mg layer 43 provided between the first intermetallic compound layer 41 and the second intermetallic compound layer 42, and thus the growth of the intermetallic compounds is suppressed by the Cu—Al—Mg layer 43, an $\eta_2$ phase, a $\zeta_2$ phase, and a δ phase, which are relatively hard, are not provided, and it is possible to suppress the generation of a crack in the compound layer 40 when loaded with a hot-cold cycle.

In addition, in the present embodiment, the thickness of the compound layer 40 is set to 10 μm or more, thus, Cu atoms and Al atoms sufficiently diffuse into each other, and it is possible to reliably bond the heat sink 31 and the metal layer 13 (Cu layer 13B) through solid-phase diffusion.

Furthermore, in the present embodiment, the thickness of the compound layer 40 is set to 70 μm or less, thus, the intermetallic compounds do not grow more than necessary, and it is possible to suppress the generation or the like of a crack in the compound layer 40.

In addition, in the present embodiment, the thickness of the Cu—Al—Mg layer 43 is set to 1 μm or more, and thus it is possible to reliably suppress the growth of the intermetallic compounds.

Furthermore, in the present embodiment, the thickness of the Cu—Al—Mg layer 43 is set to 45 μm or less, thus, the growth of the intermetallic compounds is not impaired more than necessary, and it is possible to reliably bond the heat sink 31 and the metal layer 13 (Cu layer 13B) through solid-phase diffusion.

In addition, in the present embodiment, in a case where a magnesium oxide film is provided on the bonding surface of the heat sink 31, it is possible to suppress the diffusion of Al atoms by the magnesium oxide film and suppress the intermetallic compounds growing more than necessary. Therefore, it is possible to suppress the generation of a crack in the compound layer 40 when loaded with a hot-cold cycle.

Furthermore, in a case where the magnesium oxide film has a crystalline granular body, the strength of the magnesium oxide film improves, and it becomes possible to further improve the bonding strength between the heat sink 31 and the metal layer 13 (Cu layer 13B).

Second Embodiment

Figure 6:
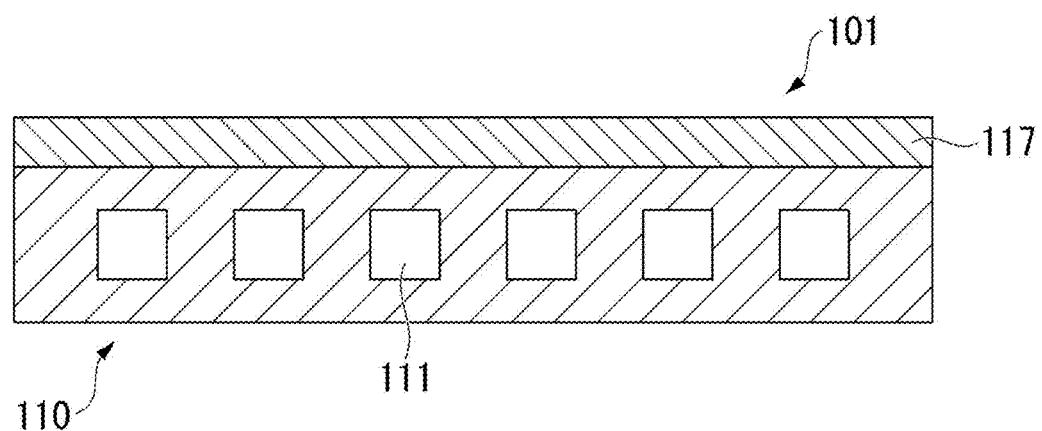
FIG. 6 is a schematic explanatory view of a heat sink according to a second embodiment of the present invention.

Next, a heat sink that is a second embodiment of the present invention will be described. FIG. 6 shows a heat sink 101 according to the second embodiment of the present invention.

Figure 9:
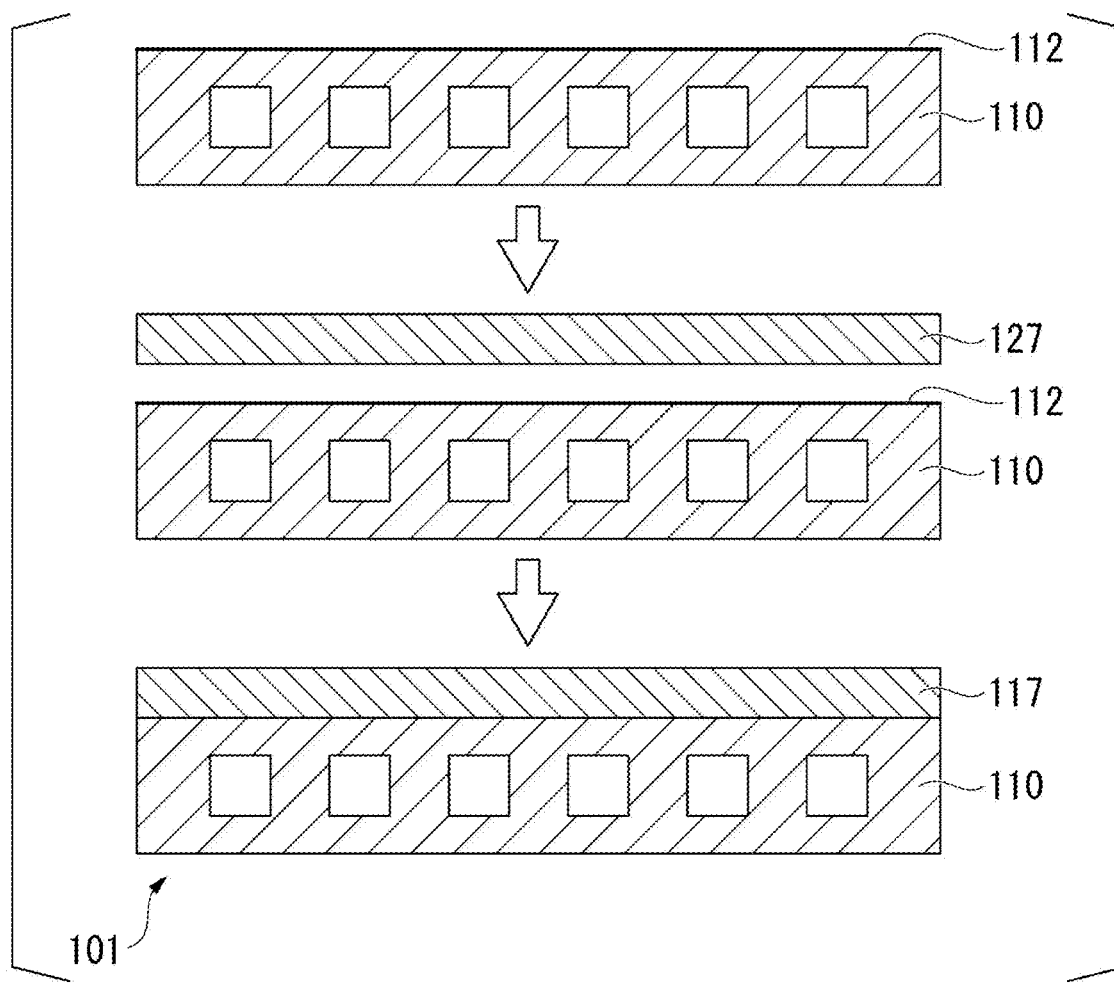
FIG. 9 is a schematic explanatory view of the method for manufacturing the heat sink according to the second embodiment.

This heat sink 101 includes a heat sink main body 110 and a copper member layer 117 that is laminated on one surface (upper side in FIG. 6) of the heat sink main body 110 and made of copper or a copper alloy. In the present embodiment, the copper member layer 117 is configured by bonding a copper plate 127 made of a rolled plate of oxygen-free copper as shown in FIG. 9.

The heat sink main body 110 is provided with flow paths 111 through which a cooling medium flows. This heat sink main body 110 is made of an aluminum alloy having a Mg concentration set in a range of 0.4 mass % or more and 7.0 mass % or less and a Si concentration set to less than 1 mass %. In this aluminum alloy, it is considered that the Si concentration is less than 1 mass % and Si forms a solid solution in the matrix.

Here, the heat sink main body 110 and the copper member layer 117 are bonded to each other through solid-phase diffusion.

Figure 7:
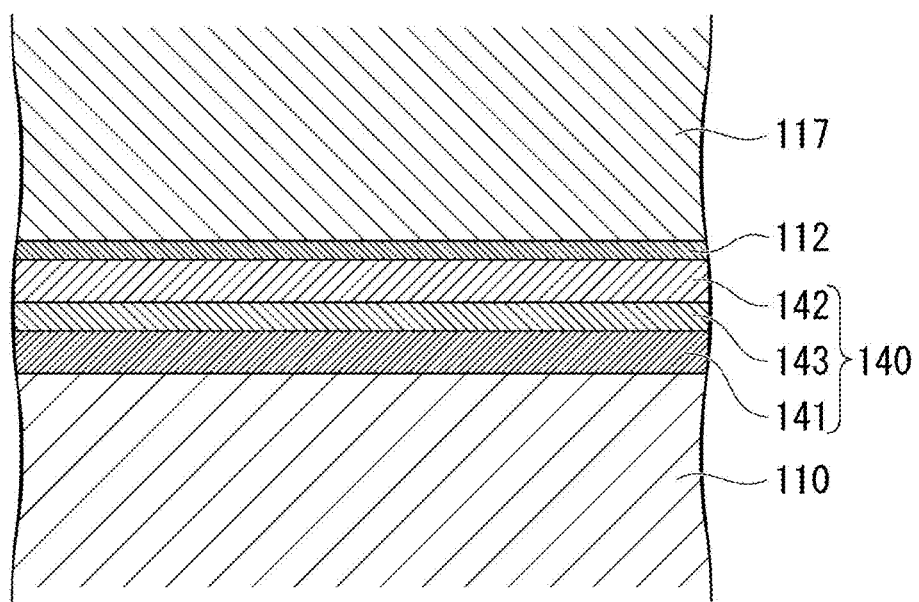
FIG. 7 is an enlarged cross-sectional explanatory view of a bonding interface between a heat sink main body and a copper member layer of the heat sink shown in FIG. 6.

In the bonding interface between the heat sink main body 110 and the copper member layer 117, as shown in FIG. 7, a compound layer 140 containing Al and Cu is provided. This compound layer 140 is provided by the mutual diffusion of metal atoms in the heat sink main body 110 and Cu atoms in the copper member layer 117.

In addition, as shown in FIG. 7, this compound layer 140 is made up of a first intermetallic compound layer 141 that is disposed on the heat sink main body 110 side and made of a θ phase of an intermetallic compound of Cu and Al, a second intermetallic compound layer 142 that is disposed on the copper member layer 117 side and made of a $\gamma_2$ phase of an intermetallic compound of Cu and Al, and a Cu—Al—Mg layer 143 provided between the first intermetallic compound layer 141 and the second intermetallic compound layer 142.

In the present embodiment, the Cu—Al—Mg layer 143 is made of $Cu_6Al_5Mg_2$, $CuAl_2Mg$, $Cu_3Al_7Mg_6$, CuAlMg, or the like, which is an intermetallic compound of Cu, Al, and Mg.

In addition, Mg in this Cu—Al—Mg layer 143 is Mg that has diffused from the aluminum alloy configuring the heat sink main body 110. Therefore, in a vicinity of the bonding interface of the heat sink main body 110, a Mg-deficient layer deficient in Mg is provided.

In the bonding interface between the heat sink main body 110 and the copper member layer 117, a magnesium oxide film 112 is provided on the surface portion of the heat sink main body 110.

This magnesium oxide film 112 is provided by the reaction of an alumina film provided on the surface of the heat sink main body 110 with Mg in the heat sink main body 110 (aluminum alloy).

Here, the magnesium oxide film 112 is made of MgO or $MgAl_2O_4$.

In addition, the magnesium oxide film preferably has a crystalline granular body. The crystalline granular body is generated by the reaction of an amorphous aluminum film with Mg, and thus the presence of the crystalline granular body leads to the sufficient progress of the reaction between the alumina film and Mg.

Figure 8:
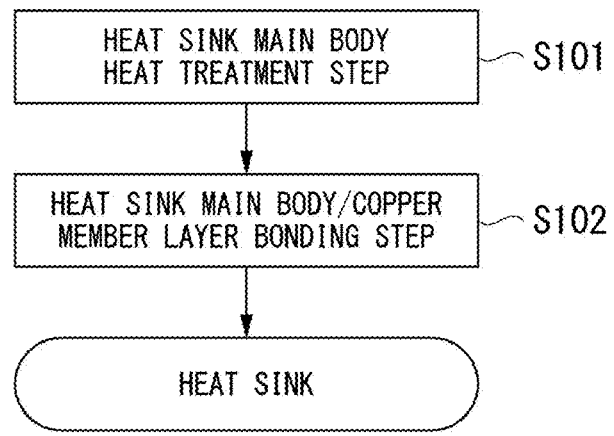
FIG. 8 is a flowchart showing a method for manufacturing the heat sink according to the second embodiment.

Next, a method for manufacturing the heat sink 101, which is the present embodiment, will be described with reference to FIG. 8 and FIG. 9.

(Heat Sink Main Body Heat Treatment Step S101)

First, a heat treatment is carried out on the heat sink main body 110 to be bonded, thereby providing the magnesium oxide film 112 on the surface of the heat sink main body 110. The conditions for the heat treatment at this time are an atmosphere of a vacuum or a nitrogen atmosphere in a range of $10^{-6}$ Pa or more and $10^{-3}$ Pa or less, a heat treatment temperature of 250° C. or higher and 400° C. or lower, and a holding time at the heat treatment temperature of 10 minutes or longer and 30 minutes or shorter.

(Heat Sink Main Body/Copper Member Layer Bonding Step S102)

Next, as shown in FIG. 9, the heat sink main body 110 and the copper plate 127 that serves as the copper member layer 117 are laminated together, disposed, and heated in a vacuum heating furnace in a state of being pressurized (at a pressure of 5 to 35 $kgf/cm^2$ (0.5 to 3.5 MPa)) in the lamination direction, thereby bonding the copper plate 127 and the heat sink main body 110 through solid-phase diffusion. The surfaces to be bonded of the copper plate 127 and the heat sink main body 110 each, which are to be bonded to each other through solid-phase diffusion, are flattened by removing damage on the surfaces in advance.

Here, it is preferable that the pressure in the vacuum heating furnace is set to be in a range of $10^{-6}$ Pa or more and $10^{-3}$ Pa or less, the heating temperature is set to be in a range of 450° C. or higher and 520° C. or lower, and the holding time at the heating temperature is set to be in a range of 30 minutes or longer and 240 minutes or shorter.

In this heat sink main body/copper member layer bonding step S102, Cu atoms in the copper plate 127 and Al atoms and Mg atoms in the heat sink main body 110 diffuse into each other, thereby providing the compound layer 140 made up of the first intermetallic compound layer 141, the Cu—Al—Mg layer 143, and the second intermetallic compound layer 142 as shown in FIG. 7.

The heat sink 101, which is the present embodiment, is manufactured as described above.

According to the heat sink 101 according to the present embodiment configured as described above, the copper member layer 117 is provided by bonding the copper plate 127 made of a rolled plate of oxygen-free copper to one surface of the heat sink main body 110, and thus it is possible to spread heat in the surface direction by the copper member layer 117 and significantly improve a heat dissipation characteristic. In addition, it is possible to favorably bond other members and the heat sink 101 using solder or the like.

In addition, in the present embodiment, in the bonding interface between the heat sink main body 110 and the copper member layer 117, the compound layer 140 provided by the diffusion of Al atoms and Mg atoms in the heat sink main body 110 and Cu atoms in the copper member layer 117 is provided in the bonding interface between the heat sink main body 110 and the copper member layer 117 as shown in FIG. 7, and this compound layer 140 is made up of the first intermetallic compound layer 141 that is disposed on the heat sink main body 110 side and made of a θ phase of an intermetallic compound of Cu and Al, the second intermetallic compound layer 142 that is disposed on the copper member layer 117 side and made of a $\gamma_2$ phase of an intermetallic compound of Cu and Al, and the Cu—Al—Mg layer 143 provided between the first intermetallic compound layer 141 and the second intermetallic compound layer 142, and thus the growth of the intermetallic compounds is suppressed by the Cu—Al—Mg layer 143, an $\eta_2$ phase, a $\zeta_2$ phase, and a δ phase, which are relatively hard, are not provided, and it is possible to suppress the generation of a crack in the compound layer 140 when loaded with a hot-cold cycle.

Furthermore, in the present embodiment, the magnesium oxide film 112 is provided on the surface of the heat sink main body 110, and thus it is possible to suppress the diffusion of Al atoms by this magnesium oxide film 112 and further suppress the intermetallic compounds growing more than necessary.

In addition, in a case where the magnesium oxide film 112 has a crystalline granular body, the strength of the magnesium oxide film 112 improves, and it becomes possible to further improve the bonding strength between the heat sink main body 110 and the copper member layer 117.

Hitherto, the embodiments of the present invention have been described, but the present invention is not limited thereto and can be appropriately modified within the scope of the technical concept of the invention.

Figure 10:
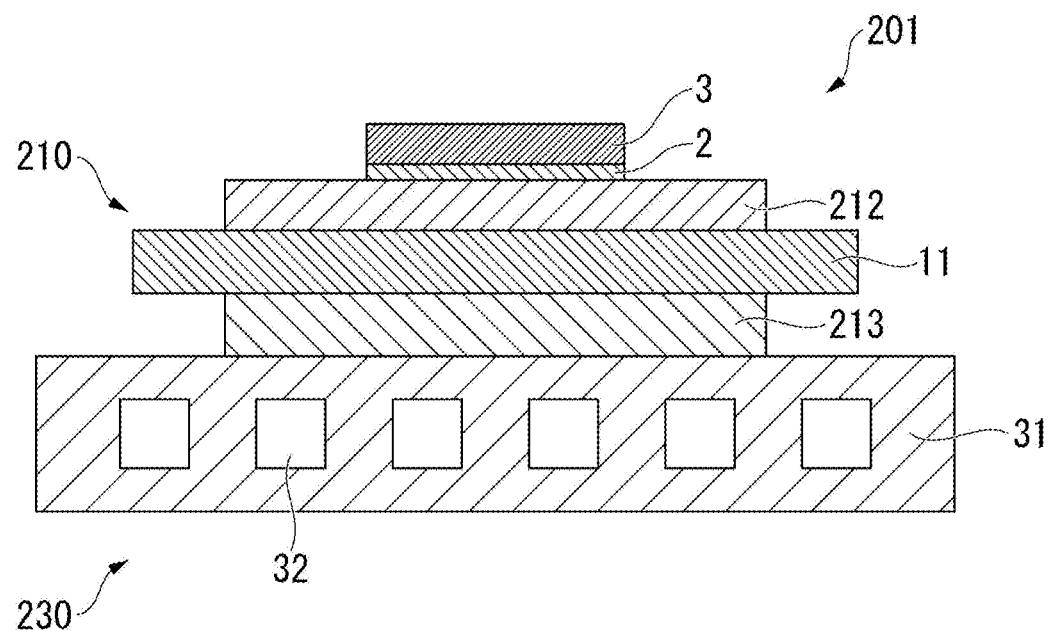
FIG. 10 is a schematic explanatory view of a power module including an insulated circuit board with a heat sink that is a different embodiment of the present invention.

For example, in the first embodiment, the metal layer 13 has been described to have the Al layer 13A and the Cu layer 13B, but is not limited thereto, and, as shown in FIG. 10, the entire metal layer may be made of copper or a copper alloy. In an insulated circuit board with a heat sink 230 shown in FIG. 10, a copper plate is bonded to the other surface (lower side in FIG. 10) of the ceramic substrate 11 using a DBC method, an active metal brazing method, or the like, thereby providing a metal layer 213 made of copper or a copper alloy. In addition, the metal layer 213 and the heat sink 31 are bonded to each other through solid-phase diffusion. In an insulated circuit board 210 shown in FIG. 10, a circuit layer 212 is also made of copper or a copper alloy.

In addition, in the first embodiment, the circuit layer has been described to be provided by bonding the aluminum plate having a purity of 99 mass %, but is not limited thereto, and may be made of different metal such as pure aluminum having a purity of 99.99 mass % or more, different aluminum or a different aluminum alloy, or copper or a copper alloy. In addition, the circuit layer may have a bilayer structure of an Al layer and a Cu layer. This is also true for the insulated circuit board 210 shown in FIG. 10.

Figure 11:
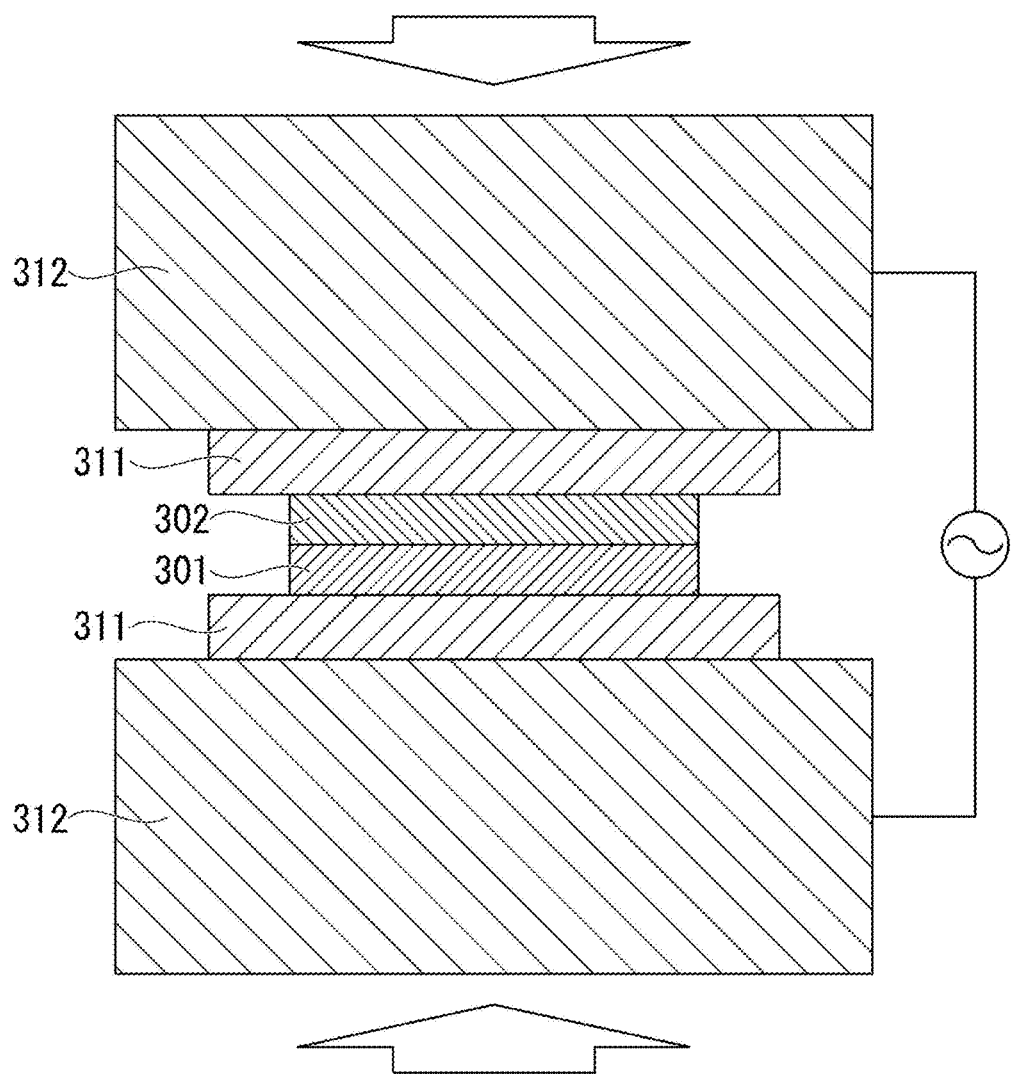
FIG. 11 is a schematic explanatory view showing a status in which solid-phase diffusion bonding is carried out using an ohmic heating method.

In addition, it has been described that, in the metal layer/heat sink bonding step S04 of the first embodiment, the metal layer 13 (Cu layer 13B) and the heat sink 31 are laminated together, disposed, and heated in a vacuum heating furnace in a state of being pressurized in the lamination direction, and, in the heat sink main body/copper member layer bonding step S102 of the second embodiment, the heat sink main body 110 and the copper plate 127 that serves as the copper member layer 117 are laminated together, disposed, and heated in a vacuum heating furnace in a state of being pressurized (at a pressure of 5 to 35 kgf/cm$^2$ (0.5 to 3.5 MPa)) in the lamination direction, but the configurations are not limited thereto, and, as shown in FIG. 11, an ohmic heating method may be applied at the time of bonding an aluminum alloy member 301 (heat sink 31 or heat sink main body 110) and a copper member 302 (metal layer 13 or copper member layer 117) through solid-phase diffusion.

In the case of carrying out ohmic heating, as shown in FIG. 11, the aluminum alloy member 301 and the copper member 302 are laminated together, the laminate of these is pressured in the lamination direction by a pair of electrodes 312 and 312 through carbon plates 311, 311, and energization is carried out on the aluminum alloy member 301 and the copper member 302. Then, the carbon plates 311, 311, the aluminum alloy member 301, and the copper member 302 are heated by Joule heat, whereby the aluminum alloy member 301 and the copper member 302 are bonded to each other through solid-phase diffusion.

In the ohmic heating method, the aluminum alloy member 301 and the copper member 302 are directly ohmic-heated, and thus it is possible to make the temperature increase rate as relatively fast as, for example, 30° C. to 100° C./min and carry out solid-phase bonding within a short period of time. Therefore, the influence of the oxidation of the bonding surface is small, and it becomes possible to bond the members even in, for example, the atmospheric atmosphere. In addition, depending on the resistance values or specific heats of the aluminum alloy member 301 and the copper member 302, it becomes possible to bond the members even in a state in which a temperature difference is caused between the aluminum alloy member 301 and the copper member 302, and it is also possible to decrease the difference in thermal expansion and reduce thermal stress.

Here, in the ohmic heating method, the pressurization load by the pair of electrodes 312, 312 is preferably set in a range of 30 kgf/cm$^2$ or more and 100 kgf/cm$^2$ or less (3 MPa or more and 10 MPa or less).

In addition, in the case of applying the ohmic heating method, regarding the surface roughness of the aluminum alloy member 301 and the copper member 302, it is preferable that the arithmetic average roughness Ra is set to be in a range of 0.3 µm or more and 0.6 µm or less or the maximum height Rz is set to be in a range of 1.3 µm or more and 2.3 µm or less. In ordinary solid-phase diffusion bonding, the surface roughness of a bonding surface is preferably small; however, in the case of the ohmic heating method, when the surface roughness of a bonding surface is too small, the interface contact angle decreases, and it becomes difficult to locally heat the bonding interface, and thus the surface roughness is preferably set in the aforementioned ranges.

The aforementioned ohmic heating method can also be used in the metal layer/heat sink bonding step S04 of the first embodiment; however, in this case, the ceramic substrate 11 is an insulator, and thus it is necessary to short-circuit the carbon plates 311, 311 using, for example, a jig made of carbon or the like. The bonding conditions are the same as those for the bonding of the aluminum alloy member 301 and the copper member 302.

In addition, for the surface roughness of the metal layer 13 (Cu layer 13B) and the heat sink 31, the above description of the surface roughness of the aluminum alloy member 301 and the copper member 302 is also true.

EXAMPLES

Hereinafter, the results of confirmation experiments carried out to confirm the effect of the present invention will be described.

Example 1

A copper plate made of oxygen-free copper (40 mm×40 mm, 5 mm in thickness) was bonded to one surface of an aluminum alloy plate (50 mm×50 mm, 5 mm in thickness) shown in Table 1 through solid-phase diffusion using a method described in the embodiments. In Examples 6 and 7, a heat treatment is carried out on the aluminum alloy plate, and then the aluminum alloy plate was bonded to the copper plate through sold-phase diffusion.

In Example 1-7 and Comparative Example 1-3, the aluminum plate and a metal layer were pressurized with a load of 15 kgf/cm$^2$ (1.5 MPa) in the lamination direction and bonded to each other through solid-phase diffusion under conditions of 500° C. in a vacuum heating furnace for 180 minutes.

(Structure of Compound Layer)

A cross section of a bonded body of the aluminum alloy plate and the metal plate bonded to each other through solid-phase diffusion was observed, and the structure of a compound layer provided in the bonding interface was evaluated as described below. The evaluation results are shown in Table 1.

(Layer Structure)

An electronic diffraction pattern was analyzed using a transmission electron microscope (Titan ChemiSTEM manufactured by Thermo Fisher Scientific, accelerating voltage of 200 kV), the composition was analyzed using an energy dispersive X-ray analysis method (NSS7 manufactured by Thermo Fisher Scientific), and provided layers were determined. The electronic diffraction pattern was obtained by radiating electron beams concentrated to approximately 1 nm (NBD method).

(Hot-Cold Cycle Test)

Next, on the bonded body manufactured as described above, a hot-cold cycle test was carried out. A heat cycle of −50° C. for 45 minutes and 175° C. for 45 minutes was carried out 2,500 times in an air tank on a test specimen (power module with a heat sink) using an air to air thermal shock tester TSA-72ES manufactured by ESPEC Corp.

In addition, the heat resistance and bonding rate in the thickness direction of the bonded body before the hot-cold cycle test and the heat resistance and bonding rate in the thickness direction of the bonded body after the hot-cold cycle test were evaluated as described below.

(Bonding Rate Evaluation)

The bonding rate of a bonding portion between the aluminum plate and the metal plate of the bonded body was evaluated using an ultrasonic flaw detection device and computed from the following expression. Here, the initial bonding area refers to the area to be bonded before bonding, that is, the area of the aluminum plate. In an ultrasonic flaw detection image, peeling is indicated by a white portion, and thus the area of the white portion was regarded as the peeled area. The evaluation results are shown in Table 1.

Bonding rate (%)={(initial bonding area)−(peeled area)}/(initial bonding area)×100

(Measurement of Heat Resistance)

A heater chip (13 mm×10 mm×0.25 mm) was soldered to the surface of the metal plate, and the aluminum alloy plate was bonded to a cooler by brazing. Next, the heater chip was heated with a power of 100 W, and the temperature of the heater chip was measured using a thermocouple. In addition, the temperature of a cooling medium (ethylene glycol: water=9:1) flowing in the cooler was measured. In addition, a value obtained by dividing the difference between the temperature of the heater chip and the temperature of the cooling medium by the power was regarded as the heat resistance.

The heat resistance of Comparative Example 1 before the heat cycle test was regarded as one as a reference, and the heat resistances of other examples were evaluated using the ratios of those to the heat resistance of Comparative Example 1. The evaluation results are shown in Table 1.

copper alloy are bonded to each other through solid-phase diffusion and the provision of a relatively hard intermetallic compound layer in the bonding interface can be suppressed.

Example 2

A copper plate made of oxygen-free copper (2 mm×2 mm, 1 mm in thickness) was bonded to one surface of an aluminum alloy plate (10 mm×10 mm 3 mm in thickness) shown in Table 2 through solid-phase diffusion using a method described in the embodiments. The aluminum plate and a metal layer were pressurized with a load of 15 kgf/cm² (1.5 MPa) in the lamination direction and bonded to each

TABLE 1

| | Aluminum alloy | | | Bonded body | | | |
| --- | --- | --- | --- | --- | --- | --- | --- |
| | | | | Before hot-cold cycle load | | After hot-cold cycle load | |
| | Si concentration (mass %) | Mg concentration (mass %) | Layer structure of compound layer | Bonding rate (%) | Heat resistance | Bonding rate (%) | Heat resistance |
| Example 1 | 0.9 | 4.1 | θ/Cu—Al—Mg/$\gamma_2$ | 98.3 | 1.00 | 95.6 | 1.04 |
| Example 2 | 0.1 | 4.7 | θ/Cu—Al—Mg/$\gamma_2$ | 98.8 | 1.02 | 94.6 | 1.04 |
| Example 3 | 0.6 | 7.0 | θ/Cu—Al—Mg/$\gamma_2$ | 95.7 | 1.04 | 94.2 | 1.05 |
| Example 4 | 0.1 | 1.7 | θ/Cu—Al—Mg/$\gamma_2$ | 96.4 | 1.03 | 95.1 | 1.04 |
| Example 5 | 0.7 | 3.2 | θ/Cu—Al—Mg/$\gamma_2$ | 95.4 | 1.04 | 94.9 | 1.04 |
| Example 6 | 0.1 | 0.4 | θ/Cu—Al—Mg/$\gamma_2$ | 96.4 | 1.03 | 94.2 | 1.05 |
| Example 7 | 0.2 | 1.4 | θ/Cu—Al—Mg/$\gamma_2$ | 98.5 | 1.02 | 94.7 | 1.04 |
| Comparative Example 1 | 6.0 | 12.7 | θ + Mg—Si/$\gamma_2$ | 99.4 | 1.00 | 90.5 | 1.08 |
| Comparative Example 2 | 0.5 | 0.1 | θ/$\eta_2$/$\zeta_2$/δ/$\gamma_2$ | 99.2 | 1.01 | 91.4 | 1.07 |
| Comparative Example 3 | 0.5 | 10.3 | θ/Cu—Al—Mg/$\gamma_2$ | 98.3 | 1.02 | 89.9 | 1.08 |

In Comparative Example 1 in which the Si concentration of the aluminum alloy plate was set to 6.0 mass % and the Mg concentration was set to 12.7 mass %, a θ phase and a Mg—Si phase were present in the compound layer, the bonding rate after the hot-cold cycle test was low, and the heat resistance became great.

In Comparative Example 2 in which the Mg concentration of the aluminum alloy plate was set to 0.1 mass %, an $\zeta_2$ phase, a phase, and a δ phase, which were intermetallic compounds of Cu and Al, were provided in the compound layer, the bonding rate after the hot-cold cycle test was low, and the heat resistance became great.

In Comparative Example 3 in which the Mg concentration of the aluminum alloy plate was set to 10.3 mass %, the bonding rate after the hot-cold cycle test was low, and the heat resistance became great. It is assumed to be because a Cu—Al—Mg phase was provided thick in the compound layer, and thus the growth of the intermetallic compound was impaired more than necessary, the thickness of the intermetallic compound layer became uneven, furthermore, the hardness of the aluminum alloy plate increased, and the stress load on the interface increased, which generated a crack.

In contrast, according to the examples, a Cu—Al—Mg phase was appropriately provided in the compound layer, the bonding rate was high before and after the hot-cold cycle, and it was possible to suppress the heat resistance to be small.

From what has been described above, it was confirmed that, according to Examples 1 to 7, it is possible to provide a bonded body in which an aluminum member made of an aluminum alloy and a copper member made of copper or a other through solid-phase diffusion at a temperature for a holding time shown in Table 2.

For the obtained bonded body, the layer structure of a compound layer provided in the bonding interface was confirmed using the same method as in Example 1. As a result, in all of Examples 11 to 22, the layer structures were "θ/Cu—Al—Mg/$\gamma_2$".

In addition, the presence or absence of a magnesium oxide film, the presence or absence of a granular body in the magnesium oxide film, and the bonding strength (shear strength) were evaluated.
(Presence or Absence of Magnesium Oxide Film/Presence or Absence of Amorphous Oxide Film/Presence or Absence of Granular Body)

Figure 12:
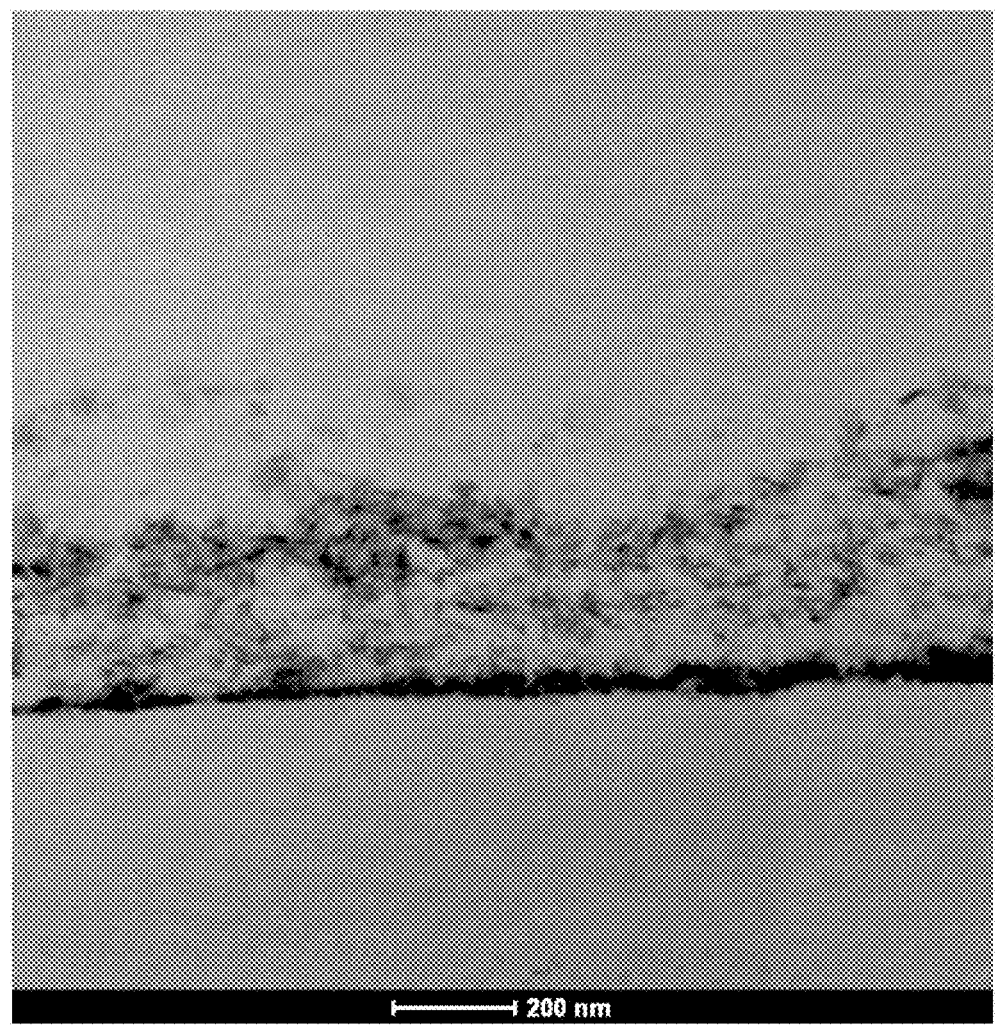
FIG. 12 is a photograph showing the observation result of a magnesium oxide film of Example 16 in Example 2.

Measurement was carried out using a transmission electron microscope (Titan ChemiSTEM manufactured by Thermo Fisher Scientific, accelerating voltage of 200 kV) at a magnification of 60,000 times, and an element mapping of Cu, Al, Mg, and O was acquired using an energy dispersive X-ray analysis method (NSS7 manufactured by Thermo Fisher Scientific). A region in which Mg and O were present in the same region in a region in which Cu and Al were present alike was regarded as a magnesium oxide layer. In addition, the presence or absence of a granular body in the magnesium oxide film was confirmed. The observation result of the magnesium oxide film in Example 16 is shown in FIG. 12.

In addition, an electronic diffraction pattern was obtained by a nanobeam diffraction method (NBD method) in which electron beams concentrated to 1 nm was used. In addition, in a case where the electronic diffraction pattern had a halo pattern, an amorphous oxide film was determined to be "present".

(Bonding Strength)

The shear strength was measured using a shear tester. The aluminum alloy plate was horizontally fixed with the copper plate thereon, the copper plate was horizontally pressed (at a shear rate of 0.1 mm/sec) from the side using a shear tool, and a strength when the bonding between the copper plate and the aluminum alloy plate broke and the position of the break (breaking mode) were confirmed. A shear strength test was carried out 20 times, and the average value was used as the strength. The evaluation results are shown in Table 2.

TABLE 2

|  | Aluminum alloy | | Bonding conditions | | Presence or absence of oxide film | Magnesium oxide film | | Shear strength (MPa) |
|---|---|---|---|---|---|---|---|---|
|  | Si concentration (mass %) | Mg concentration (mass %) | Bonding temperature (° C.) | Holding time (min) |  | Presence or absence of amorphous oxide film | Presence or absence of crystalline granular body |  |
| Example 11 | 0.1 | 0.4 | 500 | 30 | Present | Present | Present | 188.2 |
| Example 12 | 0.1 | 0.4 | 500 | 90 | Present | Present | Present | 196.7 |
| Example 13 | 0.1 | 0.4 | 500 | 180 | Present | Absent | Present | 219.5 |
| Example 14 | 0.1 | 1.7 | 500 | 180 | Present | Absent | Present | 223.6 |
| Example 15 | 0.1 | 1.7 | 520 | 180 | Present | Absent | Present | 236.1 |
| Example 16 | 0.1 | 1.7 | 520 | 240 | Present | Absent | Present | 248.8 |
| Example 17 | 0.7 | 3.2 | 480 | 180 | Present | Present | Present | 183.6 |
| Example 18 | 0.7 | 3.2 | 500 | 180 | Present | Absent | Present | 233.1 |
| Example 19 | 0.7 | 3.2 | 520 | 180 | Present | Absent | Present | 240.8 |
| Example 20 | 0.6 | 7.0 | 450 | 240 | Present | Absent | Present | 217.9 |
| Example 21 | 0.6 | 7.0 | 500 | 180 | Present | Absent | Present | 233.9 |
| Example 22 | 0.6 | 7.0 | 500 | 240 | Present | Absent | Present | 233.6 |

It was confirmed that, when the bonding temperature is high, and the holding time becomes long, the bonding strength further improves. This is assumed to be because an alumina film provided on the surface of the aluminum alloy plate and Mg in the aluminum alloy plate reacted with each other to provide the magnesium oxide film and, in this magnesium oxide film, the proportion of a crystalline granular body increased.

INDUSTRIAL APPLICABILITY

According to the present invention, it becomes possible to provide a bonded body capable of suppressing the provision of a relatively hard intermetallic compound layer in a bonding interface even in the case of bonding an aluminum member made of aluminum or an aluminum alloy and a copper member made of copper or a copper alloy through solid-phase diffusion and capable of suppressing an increase in heat resistance under a hot-cold cycle load or a decrease in the bonding rate, an insulated circuit board with a heat sink and a heat sink which include the bonded body.

REFERENCE SIGNS LIST 10, 210 Insulated circuit board
11 Ceramic substrate
13, 213 Metal layer
13B Cu layer (copper member)
31 Heat sink (aluminum alloy member)
40 Compound layer
41 First intermetallic compound layer
42 Second intermetallic compound layer
43 Cu—Al—Mg layer
101 Heat sink
110 Heat sink main body (aluminum alloy member)
117 Copper member layer
140 Compound layer
141 First intermetallic compound layer
142 Second intermetallic compound layer
143 Cu—Al—Mg layer

What is claimed is:

1. A bonded body having an aluminum alloy member made of an aluminum alloy and a copper member made of copper or a copper alloy that are bonded to each other,
wherein the aluminum alloy member is made of an aluminum alloy having a Mg concentration set in a range of 0.4 mass % or more and 7.0 mass % or less and a Si concentration set to less than 1 mass %, the aluminum alloy member and the copper member are bonded to each other through solid-phase diffusion,
a compound layer provided by diffusion of metal atoms in the aluminum alloy member and Cu atoms in the copper member is provided in a bonding interface between the aluminum alloy member and the copper member, and
the compound layer is made up of a first intermetallic compound layer that is disposed on the aluminum alloy member side and made of a θ phase of an intermetallic compound of Cu and Al, a second intermetallic compound layer that is disposed on the copper member side and made of a $\gamma_2$ phase of an intermetallic compound of Cu and Al, and a Cu—Al—Mg layer provided between the first intermetallic compound layer and the second intermetallic compound layer.

2. The bonded body according to claim 1,
wherein a magnesium oxide film is provided on a bonding surface of the aluminum alloy member.

3. The bonded body according to claim 2,
wherein the magnesium oxide film has a crystalline granular body.

4. An insulated circuit board with a heat sink comprising:
an insulating layer; a circuit layer provided on one surface of the insulating layer; a metal layer provided on an other surface of the insulating layer; and a heat sink disposed on a surface of the metal layer opposite to the insulating layer,
wherein a bonding surface with the heat sink of the metal layer is made of copper or a copper alloy,
a bonding surface with the metal layer of the heat sink is made of an aluminum alloy having a Mg concentration set in a range of 0.4 mass % or more and 7.0 mass % or less and a Si concentration set to less than 1 mass %, the heat sink and the metal layer are bonded to each other through solid-phase diffusion, a compound layer provided by diffusion of metal atoms in the aluminum alloy and Cu atoms in the copper member is provided in a bonding interface between the heat sink and the metal layer, and this compound layer is made up of a first intermetallic compound layer that is disposed on the heat sink side and made of a θ phase of an intermetallic compound of Cu and Al, a second intermetallic compound layer that is disposed on the metal layer side and made of a $\gamma_2$ phase of an intermetallic compound of Cu and Al, and a Cu—Al—Mg layer provided between the first intermetallic compound layer and the second intermetallic compound layer.

5. The insulated circuit board with a heat sink according to claim 4, wherein a magnesium oxide film is provided on a bonding surface of the heat sink.

6. The insulated circuit board with a heat sink according to claim 5, wherein the magnesium oxide film has a crystalline granular body.

7. A heat sink comprising: a heat sink main body; and a copper member layer that is bonded to the heat sink main body and made of copper or a copper alloy, wherein the heat sink main body is made of an aluminum alloy having a Mg concentration set in a range of 0.4 mass % or more and 7.0 mass % or less and a Si concentration set to less than 1 mass %, the heat sink main body and the copper member layer are bonded to each other through solid-phase diffusion, a compound layer provided by diffusion of metal atoms in the heat sink main body and Cu atoms in the copper member layer is provided in a bonding interface between the heat sink main body and the copper member layer, and this compound layer is made up of a first intermetallic compound layer that is disposed on the heat sink main body side and made of a θ phase of an intermetallic compound of Cu and Al, a second intermetallic compound layer that is disposed on the copper member layer side and made of a $\gamma_2$ phase of an intermetallic compound of Cu and Al, and a Cu—Al—Mg layer provided between the first intermetallic compound layer and the second intermetallic compound layer.

8. The heat sink according to claim 7, wherein a magnesium oxide film is provided on a bonding surface of the heat sink main body.

9. The heat sink according to claim 8, wherein the magnesium oxide film has a crystalline granular body.

* * * * *